United States Patent
Eberhardt et al.

(10) Patent No.: US 8,890,140 B2
(45) Date of Patent: Nov. 18, 2014

(54) RADIATION-EMITTING COMPONENT WITH A SEMICONDUCTOR CHIP AND A CONVERSION ELEMENT AND METHOD FOR THE PRODUCTION THEREOF

(75) Inventors: Angela Eberhardt, Augsburg (DE); Joachim Wirth-Schoen, Guenzburg (DE); Ewald Poesl, Kissing (DE)

(73) Assignees: OSRAM OPTO Semiconductor GmbH, Regensburg (DE); OSRAM AG, Munich (DE)

( * ) Notice: Subject to any disclaimer, the term of this patent is extended or adjusted under 35 U.S.C. 154(b) by 122 days.

(21) Appl. No.: 13/580,858

(22) PCT Filed: Feb. 25, 2011

(86) PCT No.: PCT/EP2011/052851
§ 371 (c)(1),
(2), (4) Date: Oct. 26, 2012

(87) PCT Pub. No.: WO2011/104364
PCT Pub. Date: Sep. 1, 2011

(65) Prior Publication Data
US 2013/0056725 A1    Mar. 7, 2013

(30) Foreign Application Priority Data
Feb. 26, 2010   (DE) .......................... 10 2010 009 456

(51) Int. Cl.
*H01L 29/10*   (2006.01)
*H01L 33/50*   (2010.01)
*H01L 33/56*   (2010.01)

(52) U.S. Cl.
CPC .............. *H01L 33/50* (2013.01); *H01L 33/502* (2013.01); *H01L 33/507* (2013.01); *H01L 33/508* (2013.01); *H01L 33/501* (2013.01); *H01L 33/56* (2013.01)
USPC ................................................ 257/43; 438/85

(58) Field of Classification Search
CPC ... H01L 33/502; H01L 33/507; H01L 33/508; H01L 33/501; H01L 33/56; H01L 33/50
USPC ............................................... 257/43; 438/85
See application file for complete search history.

(56) References Cited

U.S. PATENT DOCUMENTS

| 3,798,114 A | 3/1974 | Chvatal |
| 4,652,536 A | 3/1987 | Nakajima et al. |

(Continued)

FOREIGN PATENT DOCUMENTS

| DE | 2222 771 A1 | 11/1972 |
| DE | 31 25 299 A1 | 5/1982 |

(Continued)

OTHER PUBLICATIONS 980 nm excited upconversion in an Er-doped ZnO—TeO2 glass, Vetrone et al. (Applied Physics Letters, vol. 80, No. 10) Mar. 11, 2002, pp. 1752-1754.*

*Primary Examiner* — Douglas Menz
(74) *Attorney, Agent, or Firm* — Slater & Matsil, L.L.P.

(57) ABSTRACT

A radiation-emitting component includes a semiconductor chip and a conversion element. The semiconductor chip includes an active layer suitable for generating electromagnetic radiation and a radiation exit face. The conversion element includes a matrix material and a luminescent material. The conversion element is arranged downstream of the radiation exit face of the semiconductor chip. The matrix material comprises at least 40 wt. % tellurium oxide and is free of boron trioxide and/or germanium oxide. A method for producing such a radiation-emitting component is furthermore stated.

20 Claims, 2 Drawing Sheets

(56) References Cited

U.S. PATENT DOCUMENTS

| | | |
|---|---|---|
| 5,116,786 A | 5/1992 | Matsuura |
| 6,066,861 A | 5/2000 | Höhn et al. |
| 7,078,732 B1 | 7/2006 | Reeh et al. |
| 7,553,683 B2 | 6/2009 | Martin et al. |
| 7,601,550 B2 | 10/2009 | Bogner et al. |
| 7,872,417 B2 * | 1/2011 | Nakamura et al. ............ 313/512 |
| 8,425,271 B2 | 4/2013 | Hussell et al. |
| 2004/0186488 A1 | 9/2004 | Droese |
| 2005/0274967 A1 | 12/2005 | Martin et al. |
| 2006/0258028 A1 | 11/2006 | Paolini et al. |
| 2008/0136326 A1 | 6/2008 | Nakamura et al. |
| 2008/0203911 A1 | 8/2008 | Beckers |
| 2009/0206352 A1 | 8/2009 | Becker et al. |
| 2009/0309125 A1 | 12/2009 | Matsumoto et al. |

FOREIGN PATENT DOCUMENTS

| | | |
|---|---|---|
| DE | 10 2005 023 134 A1 | 11/2006 |
| EP | 1 605 526 A2 | 12/2005 |
| JP | 62-128946 A | 6/1987 |
| JP | 2004186488 A | 7/2004 |
| JP | 200511933 A | 1/2005 |
| JP | 200637097 A | 2/2006 |
| JP | 2006143490 A | 6/2006 |
| JP | 2008103688 A | 5/2008 |
| WO | WO 97/50132 A1 | 12/1997 |
| WO | WO 98/12757 A1 | 3/1998 |
| WO | WO 01/65613 A1 | 9/2001 |

* cited by examiner

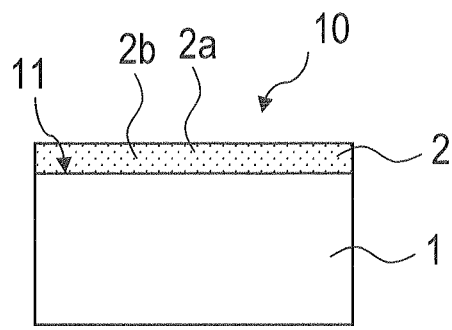
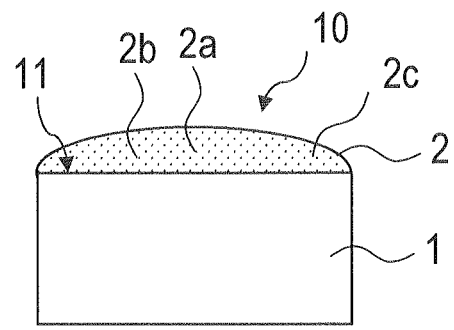
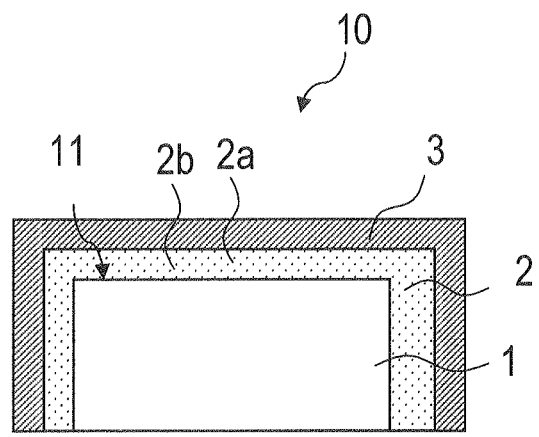
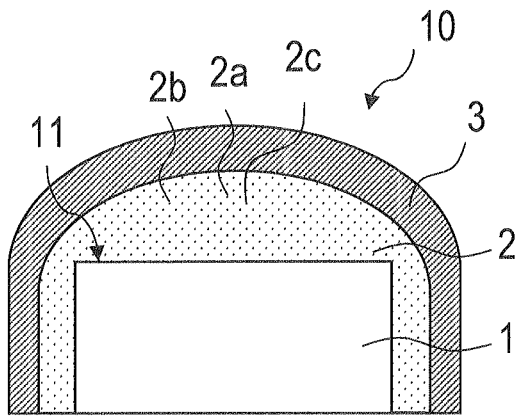

RADIATION-EMITTING COMPONENT WITH A SEMICONDUCTOR CHIP AND A CONVERSION ELEMENT AND METHOD FOR THE PRODUCTION THEREOF

This patent application is a national phase filing under section 371 of PCT/EP2011/052851, filed Feb. 25, 2011, which claims the priority of German patent application 10 2010 009 456.0, filed Feb. 26, 2010, each of which is incorporated herein by reference in its entirety.

TECHNICAL FIELD

The invention relates to a radiation-emitting component with a semiconductor chip and a conversion element. The invention further relates to a method for producing a radiation-emitting component.

BACKGROUND

Radiation-emitting components with a conversion element are known, for example, from document WO 97/50132. These components contain a semiconductor body which emits light (primary light) when in operation and a conversion element with a luminescent material which converts a proportion of the primary light into another wavelength range (secondary light). The color appearance of the light emitted by such a semiconductor component is the result of additive color mixing of primary light and secondary light.

The conversion element may be arranged in various ways downstream of the semiconductor body. For example, the conversion element consists of a potting compound, in which the luminescent material is embedded and which surrounds the semiconductor body. It is further known to arrange a conversion element with at least one luminescent material downstream of the semiconductor body.

A conversion element is conventionally used here which comprises silicone as matrix material, a luminescent material being introduced into the matrix material. The conversion element is here fastened onto a surface of the semiconductor chip by means of an adhesion layer, for example of an organic adhesive. Silicone, however, exhibits poor thermal conductivity, which may result in the luminescent material heating up when the component is in operation, so disadvantageously impairing the efficiency of the component.

U.S. Patent Application Publication No. 2009/0309125 further discloses glass encapsulation for a light-emitting device.

SUMMARY OF THE INVENTION

In one aspect, the present invention provides a radiation-emitting component which is distinguished by improved dissipation of the heat arising during operation of the component by the matrix material, consequent improved efficiency of the component and simultaneously by an elevated refractive index of the matrix material.

The invention provides a radiation-emitting component which comprises a semiconductor chip and a conversion element. The semiconductor chip comprises an active layer suitable for generating electromagnetic radiation and a radiation exit face. The conversion element comprises a matrix material of a tellurium-containing glass and a luminescent material. The conversion element is arranged downstream of the radiation exit face of the semiconductor chip.

The radiation exit face is preferably formed by a major face of the semiconductor chip. The conversion element is particularly preferably applied at least onto this major face of the semiconductor chip.

The semiconductor chip is preferably an LED chip which comprises a layer sequence which is composed of a number of different layers and contains an active layer. When the component is in operation, the active layer preferably emits at least one kind of radiation, for example ultraviolet, blue or green radiation. The active layer may for example comprise a pn-junction, a double hetero structure, a single quantum well structure (SQW structure) or a multi quantum well structure (MQW structure). Such structures are known to a person skilled in the art and are therefore not explained in greater detail at this point.

The semiconductor chip is preferably based on a nitride compound semiconductor, phosphide compound semiconductor and/or arsenide compound semiconductor. In the present context, this means that the active epitaxial layer sequence or at least one layer thereof comprises a nitride, phosphide and/or arsenide III/V compound material. The compound material may here comprise one or more dopants and additional constituents which do not substantially modify the characteristic physical properties of the compound material.

The semiconductor chip preferably emits primary radiation of a wavelength $\lambda_0$. A major part of the radiation emitted by the semiconductor chip is preferably emitted from the semiconductor chip through the radiation exit face. A conversion element is preferably arranged downstream of the semiconductor chip in the emission direction, which conversion element contains at least one luminescent material which, when excited with the wavelength $\lambda_0$, emits secondary radiation of another wavelength. In this manner, the component particularly preferably emits mixed radiation containing the primary radiation from the semiconductor chip and secondary radiation from the conversion element.

Suitable luminescent materials are known to a person skilled in the art for example from document WO 98/12757 and from document WO 01/65613 A1, the disclosure content of which is in this respect in each case hereby included by reference.

In one embodiment the conversion element is arranged directly on the radiation exit face of the semiconductor chip. Spacing is thus not provided between the semiconductor chip and conversion element. The conversion element is preferably fastened onto the radiation exit face of the semiconductor chip. The conversion element is thus fastened directly onto a major face of the semiconductor chip, no spacing and/or other layers or materials being arranged between conversion element and semiconductor chip.

For the purposes of the application, a direct arrangement between for example two layers should be taken to mean an arrangement in which the layers are arranged or fastened directly adjacent one another, wherein small air pockets or inclusions of foreign bodies such as for example dust between these layers arising from the production process should be disregarded in this respect.

In a further embodiment, spacing is provided between the conversion element and the radiation exit face of the semiconductor chip. An interspace comprising a gas, for example air, is preferably provided between the conversion element and the radiation exit face.

In a further embodiment, a deliberately introduced interlayer is arranged between the chip surface and the matrix, resulting in spacing. The interlayer is between 0 μm and 10 μm thick, preferably between one atomic layer and 0.5 μm, ideally between 1 nm and 100 nm. The interlayer may for example have an antireflection, barrier or optical filter action. In the case of an antireflection interlayer, the refractive index is between that of the chip and that of the matrix.

The matrix material of the conversion element is preferably a tellurium-containing glass. The matrix material preferably comprises at least 40 wt. % tellurium oxide ($TeO_2$). The matrix material particularly preferably comprises at least 75 wt. % tellurium oxide. In one particularly preferred embodiment, the matrix material comprises at least 90 wt. % tellurium oxide.

For example, the matrix material consists of $TeO_2$, in which the luminescent material is embedded. Alternatively, the matrix material comprises more than 75 wt. % $TeO_2$ and 9 to 24 wt. % ZnO.

The luminescent material of the conversion element is embedded in the matrix material of tellurium-containing glass. Glass advantageously exhibits better thermal conductivity than the silicone which is conventionally used, whereby dissipation of the heat arising during operation by the matrix material is advantageously increased. In this manner, the heat arising during operation, in particular that arising during operation by heating of the luminescent material in the conversion element, may be efficiently dissipated via the matrix material, so advantageously increasing the efficiency of the luminescent material and consequently the efficiency of the component.

Tellurium-containing glasses are furthermore advantageously distinguished by highly refractive properties, such that such a conversion element, in particular the matrix material, is distinguished by an elevated refractive index. Depending on the tellurium content in the glass matrix, a refractive index of $n \geq 2$ is thus possible, for example.

In a preferred embodiment, phospho-tellurite glass is used as the matrix material. Silver phospho-tellurite glass is particularly preferably used as the matrix material. Depending on the intended use of the component, the composition of the individual components of the matrix material relative to one another may here be varied.

Compositions of the matrix material made for example from phospho-tellurite glasses are known to a person skilled in the art for example from document DE 2222771 A1, the disclosure content of which is hereby explicitly included by reference.

Alternatively, when a matrix material made from silver phospho-tellurite glass is used, the silver may be completely or partially replaced for example by alkali metal or alkaline earth metal materials. The phosphorus of the matrix material may further be completely or partially substituted by other glass formers known to a person skilled in the art, such as for example $Sb_2O_3$ and/or $SiO_2$ and/or $WO_3$ and/or $MoO_3$ and/or $Bi_2O_3$ and/or $Mn_2O_7$ and/or PbO. It is likewise possible to replace some of the tellurium oxide of the matrix material by other glass formers. The matrix material is preferably RoHS compliant and is free of Pb, As, Cd, U, Tm.

In a further preferred embodiment, the matrix material is at least partially transparent to the radiation emitted by the semiconductor chip. In the wavelength range of the radiation emitted by the semiconductor chip, the matrix material preferably exhibits transparency of greater than 60%, particularly preferably of greater than 80%, preferably of greater than 95%.

In a further preferred embodiment, the matrix material is free of boron oxide and/or germanium oxide.

A matrix material containing boron oxide and/or germanium oxide therein has a disadvantageous tendency to crystallise due to segregation behaviour, whereby the conversion element no longer exhibits transparent properties. This may advantageously be counteracted by a matrix material which is free of boron oxide and germanium oxide. Segregation behavior is, for example, counteracted by a melt combination of $TeO_2$ and $P_2O_5$, thus by phospho-tellurite glasses. Good miscibility is in particular achieved in that phosphate and tellurite glasses primarily contain chain structural elements which are relatively similar in bulk, whereby a virtually homogeneous structure can be achieved.

In a further preferred embodiment, the matrix material comprises at least one additional element which increases the refractive index of the matrix material. Refractive index-increasing compounds known to a person skilled in the art, such as for example $La_2O_3$, may for example be added to the glass.

In a further embodiment, the matrix material, in particular the tellurium-containing glass, is lead-free.

In a further preferred development, the matrix material comprises at least one further additional component which exhibits radiation-absorbing properties. The further additional component preferably absorbs radiation in the wavelength range $\lambda \leq 380$ nm, preferably radiation in the wavelength range $\lambda \leq 400$ nm, particularly preferably radiation in the wavelength range $\lambda \leq 420$ nm. The further additional component preferably absorbs 20%, preferably 40%, particularly preferably 60% of the radiation in the stated wavelength range. The component may be arranged in a further matrix material as an additional layer over the conversion element or beside the conversion element. The additional layer for example comprises a component which acts as a UV filter.

In a further development, the glass-transition temperature ($T_g$) of the matrix material is at most 350° C., in particular $\leq 350°$ C. In particular, the thermal expansion of the matrix material changes at the glass-transition temperature ($T_g$) of at most 350° C.

In a further preferred development, the matrix material is a low-melting material. For the purposes of the present application, a low-melting material is considered to be a material which softens at a temperature of at most 350° C. This advantageously makes it possible to join the conversion element directly to the semiconductor chip by the bond being created between the conversion element and semiconductor chip at most 350° C., wherein at such temperatures the semiconductor chip suffers no damage when the conversion element is applied onto the radiation exit face of the semiconductor chip. A bonding wire, for example a gold wire, which is used for electrical contacting of the semiconductor chip may be completely or partially embedded in the conversion element.

In a further preferred embodiment, the matrix material or the conversion element takes the form of an adhesion layer. Such a matrix material which is distinguished by a low-melting material may, for example, be used to adhesively bond a further conversion element, a radiation-shaping element, for example an optical system or a lens, or a cover to the semiconductor chip at temperatures of at most 350° C. In this case, the conversion element is thus distinguished both by radiation-converting and by adhesion properties.

In a further preferred development, the conversion element assumes wafer form, also referred to as plate-like form. The conversion element is preferably a tellurium-containing glass wafer with luminescent material embedded therein.

In a further embodiment, the conversion element takes the form of a potting compound in which the semiconductor chip is embedded. In this case, the conversion element preferably completely encloses the semiconductor chip. There is preferably no spacing between potting compound and semiconductor chip, wherein small air pockets or inclusions of foreign bodies such as dust particles between potting compound and semiconductor chip arising from the production process may occur.

In a further preferred development, the conversion element takes the form of a beam-shaping element. For the purposes of the application, a beam-shaping element should be taken to mean an element which modifies and/or influences the emission direction of the radiation emitted by the semiconductor chip. A beam-shaping element should for example be taken to mean a lens, an optical system or a cover for example containing scattering particles. The beam-shaping element may preferably be formed by purposeful shaping or by surface tension in the matrix material on heating of the matrix material. A low-melting material is preferably suitable as matrix material for this purpose.

A method for producing a radiation-emitting component comprising a semiconductor chip and a conversion element comprises the following method steps:

providing a semiconductor chip, which comprises an active layer suitable for generating electromagnetic radiation and a radiation exit face, and applying a conversion element onto the radiation exit face of the semiconductor chip, which conversion element comprises a matrix material of tellurium-containing glass and a luminescent material.

Advantageous further developments of the method arise in a manner similar to the advantageous further developments of the component and vice versa. A component described herein may in particular be produced by means of the method.

The conversion element is preferably produced by means of a sintering method, a mixture of luminescent material and glass powder being sintered, in particular pressed, in order to minimise air pockets. Temperatures close to the softening point of the glass are used here.

In a further preferred embodiment, a liquid melt of the matrix material prepared from tellurium-containing glass with luminescent material suspended therein is produced, the liquid melt then being sprayed such that the conversion element is applied onto the radiation exit face of the semiconductor chip.

In a further preferred development, a layer of defined thickness of luminescent material and optionally further elements may be produced on a glass substrate, sintering then being performed at a temperature close to the softening point of the glass.

In a further preferred development, a luminescent material layer of luminescent material particles is applied onto the radiation exit face of the semiconductor chip, wherein tellurium-containing glass is then deposited from the gas phase into the interspaces between the luminescent material particles.

In a further preferred embodiment, a thin layer is produced from the matrix material directly on the chip or a separate wafer is produced at relatively high temperatures of above 350° C. At this temperature, the glass preferably has a viscosity of $10^{7.6}$ dPas*s≥θ≥$10^{-2}$ dPas*s, in particular of $10^{4}$ dPas*s≥θ≥$10^{-2}$ dPas*s, ideally of $10^{2}$ dPas*s≥θ≥$10^{-2}$ dPas*s. A very compact glass layer containing few bubbles is produced in this way. Said layer is then coated with luminescent material, for example YAG:Ce, using methods known to a person skilled in the art. The luminescent material particles then sink into the glass layer at lower temperatures of below 350° C. In other words, the matrix material coated with luminescent material is then heated to such an extent that the glass only slightly softens and the luminescent material sinks into the glass layer and is enclosed thereby. The sinking temperature is preferably ≥RT to ≤hemisphere temperature of the glass, better ≥Tg of the glass to ≤hemisphere temperature of the glass, better ≥softening temperature of the glass to ≤hemisphere temperature of the glass. The advantage of sinking is that only low temperatures are necessary and the luminescent material is not damaged thereby. If, for example, the matrix material is a low-melting material, the temperatures for sinking are ≤350° C.

In the case of a separate wafer, it is possible for the wafer to be positioned on the chip prior to sinking and so to be simultaneously adhesively bonded with the chip during the sinking process. The side coated with luminescent material may here face towards or away from the chip surface. Coating on both sides and coating of the end faces with the same or different luminescent materials is also possible.

In the sinking method, luminescent material may also deliberately be applied non-uniformly, for example in order to improve the module's uniformity of colour location over the emission angle. The "yellow ring" phenomenon which often occurs in white LEDs could, for example, be attenuated by deliberately non-uniform application of the luminescent material in a horizontal or lateral direction. The thickness of the matrix material, for example the glass layer, is preferably less than or equal to 200 μm, preferably less than or equal to 100 μm, in particular less than or equal to 50 μm, but at least as thick as the largest luminescent material particles.

Methods for embedding a luminescent material into glass are known to a person skilled in the art for example from document DE 102005023134 A1, the disclosure content of which is hereby explicitly included by reference in the present application.

BRIEF DESCRIPTION OF THE DRAWINGS

Further features, advantages, preferred developments and convenient aspects of the component and of the method are revealed by the exemplary embodiments explained below with reference to FIGS. 1 to 7, in which:

FIGS. 1 to 7 each show a schematic cross-section of an exemplary embodiment of a component according to the invention.

Identical or equivalently acting components are in each case denoted with identical reference numerals. The components illustrated and the size ratios of the components to one another should not be regarded as to scale.

DETAILED DESCRIPTION OF ILLUSTRATIVE EMBODIMENTS

Figure 5:
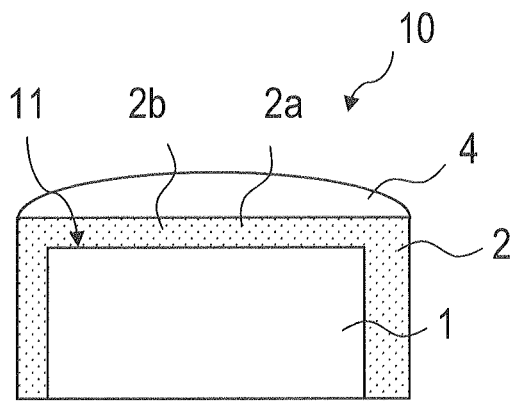

FIG. 1 shows a radiation-emitting component 10 which comprises a semiconductor chip 1 and a conversion element 2.

A radiation-emitting component should substantially be taken to mean a component which is suitable for emitting radiation when in operation. In particular, radiation emission in operation proceeds in such components by means of electrical contacting of the components.

The semiconductor chip 1 is preferably an LED chip (LED: light-emitting diode). The semiconductor chip 1 is preferably a thin-film LED. In a thin-film LED, the production substrate, on which the layer stack for the semiconductor chip 1 was produced, in particular deposited, is removed in zones or completely.

The semiconductor chip 1 comprises an active layer suitable for generating electromagnetic radiation. The active layer of the semiconductor chip 1 comprises a pn-junction, a double heterostructure, a single quantum well structure (SQW) or a multi quantum well structure (MQW) for generating radiation. The term quantum well structure does not here have any meaning with regard to the dimensionality of the quantisation. It thus encompasses inter alia quantum troughs, quantum wires and quantum dots and any combination of these structures.

The semiconductor chip 1 is preferably based on a nitride, phosphide or arsenide compound semiconductor. In the present context, based on a nitride, phosphide or arsenide compound semiconductors means that the active epitaxial layer sequence or at least one layer thereof comprises a III/V semiconductor material with the composition $In_xGa_yAl_{1-x-y}P$, $In_xGa_yAl_{1-x-y}N$ or $In_xGa_yAl_{1-x-y}As$, in each case with $0 \leq x$, $y \leq 1$ and $x+y \leq 1$.

The semiconductor chip 1 comprises a radiation exit face 11. The radiation exit face 11 is preferably formed by a major face of the semiconductor chip 1. A major face should, for example, be taken to mean the top of the semiconductor chip 1.

Means (not shown) for improving outcoupling of the radiation generated in the active layer may preferably be provided on the radiation exit face 11 of the semiconductor chip 1. Means for improving outcoupling should essentially be taken to mean surface patterning. In particular, light outcoupling may be improved by microprism patterning or increasing the roughness of the radiation exit face 11. For example, if the radiation exit face 11 is roughened, this results in the formation of an irregular surface which improves the outcoupling of light from the component, so advantageously increasing the efficiency of the semiconductor chip 1.

A conversion element 2 is arranged on the radiation exit face 11 of the semiconductor chip 1. The conversion element 2 is preferably arranged directly on the radiation exit face 11 of the semiconductor chip 1. In particular, the conversion element 2 is fastened onto the radiation exit face 11, in particular is joined mechanically and form-fittingly to the radiation exit face 11. The conversion element 2 preferably at least in part covers the light exit face 11 of the semiconductor chip 1. The conversion element 2 particularly preferably completely covers the radiation exit face 11 of the semiconductor chip 1.

The conversion element 2 comprises a matrix material 2a made from tellurium-containing glass and a luminescent material 2b. The luminescent material 2b is preferably distributed substantially uniformly in the matrix material 2a. In this way, color non-uniformities over the emission angle of the radiation emitted by the component may be reduced, so advantageously resulting in a uniform emission pattern for the radiation emitted by the component.

The semiconductor chip 1 preferably emits primary radiation with a wavelength $\lambda_0$. The luminescent material 2b in the conversion element 2 preferably absorbs at least some of the radiation of wavelength $\lambda_0$ and emits secondary radiation of another wavelength. In this way, a component may be obtained which emits mixed radiation containing both the primary radiation from the semiconductor chip 1 and the secondary radiation from the luminescent material 2b.

By means of a conversion element 2 arranged on the radiation exit face 11 of the semiconductor chip 1, it is possible to modify, in particular purposefully adjust, the color location of the radiation emitted by the semiconductor chip 2. The color location is essentially taken to mean the numerical values which describe the colour of the radiation emitted by the component in the CIE color space.

By purposefully selecting the luminescent material 2b, the color location of the radiation emitted by the semiconductor chip 1 may be purposefully corrected, so advantageously resulting in a desired color location of the radiation emitted by the component 10.

The conversion element 2 may contain more than one luminescent material 2b. Using more than one luminescent material 2b enables accurate color selection of the color location of the radiation emitted by the component, so in particular making it possible purposefully to achieve a desired color location of the mixed radiation emitted by the component. The mixed radiation of the radiation emitted by the component is preferably located in the white region of the color space.

Suitable luminescent materials which may be used in such conversion elements are known to a person skilled in the art for example from document WO 98/12757 and from document WO 01/65613 A1, the content of which is in this respect in each case hereby included by reference.

The matrix material 2a of the conversion element 2 preferably comprises a tellurium-containing glass. The matrix material preferably comprises at least 40 wt. % tellurium oxide, preferably at least 75 wt. % tellurium oxide, particularly preferably at least 90 wt. % tellurium oxide.

A matrix material 2a of glass advantageously exhibits improved thermal conductivity in comparison with the silicone matrix material used conventionally. Thanks to improved thermal conductivity of the matrix material, heating of the luminescent material 2b when in operation may advantageously be reduced, since the heat arising during operation may be purposefully dissipated away from the luminescent material 2b by the matrix material. The luminescent material exhibits improved efficiency when in operation, whereby the efficiency of the component is advantageously improved.

Tellurium-containing glasses are preferably used as the matrix material 2a as they are highly refractive. Conversion elements 2 may be obtained in this manner which are distinguished in particular by an elevated refractive index of the matrix material 2a. Depending on the tellurium content in the matrix material, refractive indices of $n \geq 2$ may be enabled in this manner.

The matrix material 2a preferably comprises phospho-tellurite glass. The matrix material 2a particularly preferably comprises silver phospho-tellurite glass. The composition of the individual components of the conversion element is here preferably variable. In addition, silver may be completely or partially replaced by for example alkali metal or alkaline earth metal and/or phosphorus may be completely or partially substituted by other glass formers known to a person skilled in the art such as $SbO_2$ or $SiO_2$. It is alternatively possible partially to replace tellurium oxide by other glass formers.

The matrix material 2a is preferably transparent to the radiation emitted by the semiconductor chip 1. The matrix material 2a is preferably free of boron oxide and germanium oxide.

A matrix material 2a containing boron oxide and/or germanium oxide therein has a disadvantageous tendency to crystallise due to segregation behaviour, whereby the conversion element 2a no longer exhibits transparent properties. This may advantageously be counteracted by a matrix material which is free of boron oxide and germanium oxide.

The matrix material 2a is preferably lead-free.

The matrix material 2a is preferably a low-melting material, in particular a low-melting tellurium-containing glass. As a result, the conversion element 2 may be joined form-fittingly to the radiation exit face 11 of the semiconductor chip 1 directly during production of the component 10. The matrix material with the luminescent material contained therein is softened at such a low temperature that the bond between conversion element 2 and semiconductor chip 1 is created at most 350° C. Damage to the semiconductor chip during the process of applying the conversion element onto the chip may consequently be avoided. A bonding wire, for example used for electrical contacting of the semiconductor chip 2, may here also be completely or partially embedded in the conversion element 2.

In the exemplary embodiment of FIG. 1, the conversion element 2 is in wafer form. The conversion element 2 preferably has a thickness in a range between preferably 1 μm and 200 μm, better between 5 μm and 100 μm, preferably between 10 μm and 50 μm, preferably between 25 μm and 30 μm, ideally substantially 30 μm.

The conversion element 2 in wafer form advantageously covers at least 80% of the radiation exit face 11 of the semiconductor chip 1. The extent of the conversion element 2 in wafer form is particularly preferably adapted to the extent of the conversion element 1. The base area of the conversion element 2 is preferably identical or virtually identical to the base area of the semiconductor chip 1.

The luminescent material 2b is preferably embedded in the matrix material 2a by means of a fusion process and/or of a sintering process. The luminescent material 2b is, for example, suspended in the matrix material 2a and then screen printed. A method for embedding a luminescent material in a matrix material, in particular in glass, is known to a person skilled in the art for example from document DE 102005023134 A1, the disclosure content of which is hereby explicitly included by reference in the present application.

A method for producing a radiation-emitting component according to the exemplary embodiment of FIG. 1 for example comprises the following method steps:

providing the semiconductor chip 1, which comprises an active layer and a radiation exit face 11, and applying the conversion element 2 onto the radiation exit face 11, wherein the conversion element 2 comprises a matrix material 2a of tellurium-containing glass and a luminescent material 2b which is preferably embedded in the matrix material 2a.

The exemplary embodiment of FIG. 2 differs from the exemplary embodiment of FIG. 1 in that the conversion element 2 takes the form of a beam-shaping element. In particular, the conversion element 2 has the shape of a convex lens. The conversion element 2 thus already takes the form of an integral lens, wherein the lens may for example arise from purposeful shaping or from the surface tension of the glass on heating of the conversion element 2.

The radiation emitted by the semiconductor chip 1 may be purposefully guided by such a conversion element 2 shaped as a lens or beam-shaping element. In particular, the emission angle of the radiation emitted by the semiconductor chip 1 may be purposefully modified and/or corrected in this way. The conversion element 2 in this way has an influence inter alia on the emission pattern and directionality and on the color location of the radiation emitted by the component. In particular, the color location is purposefully modified by the luminescent material 2b embedded in the conversion element 2, while the emission pattern and directionality are influenced by the shaping of the conversion element 2.

Furthermore, in contrast to the exemplary embodiment of FIG. 1, the conversion element of the exemplary embodiment of FIG. 2 comprises an additional element 2c which is likewise preferably uniformly embedded and distributed in the matrix material 2a of the conversion element 2. The additional element 2c preferably increases the refractive index of the matrix material 2a. A refractive index-increasing element is for example $La_2O_3$, which is added to the matrix material 2a.

The exemplary embodiment of FIG. 2 otherwise substantially corresponds to the exemplary embodiment of FIG. 1.

FIG. 3 shows a further exemplary embodiment of a component 10 which comprises a semiconductor chip 1 and a conversion element 2. In contrast to the exemplary embodiment shown in FIG. 1, the conversion element 2 of FIG. 3 is formed by a potting compound in which the semiconductor chip 1 is embedded. In particular, the semiconductor chip 1 is advantageously completely enclosed by the conversion element 2. Only a fastening side, which is preferably located on the opposite side of the semiconductor chip 1 from the radiation exit face 11, is free of conversion element 2. As a result, the component 10 may for example be arranged on and electrically and mechanically connected to a carrier, a circuit board or a PCB (Printed Circuit Board).

In contrast to the exemplary embodiment shown in FIG. 1, in the exemplary embodiment of FIG. 3 an additional layer 3 is arranged downstream of the conversion element 2, wherein the additional layer 3 preferably comprises a component which is uniformly embedded in the additional layer 3. The distribution of the component in the additional layer 3 is preferably substantially uniform. The component preferably exhibits radiation-absorbing properties. The component particularly preferably absorbs radiation in the wavelength range $\lambda \leq 380$ nm, preferably in the wavelength range $\lambda \leq 400$ nm, ideally in the wavelength range $\lambda \leq 420$ nm. In this way, organic components of the radiation-emitting component 10, such as for example a plastics housing, may be protected from shortwave radiation and any consequent damage such as for example discoloration.

The exemplary embodiment of FIG. 3 otherwise substantially corresponds to the exemplary embodiment of FIG. 1.

FIG. 4 shows a further exemplary embodiment of a radiation-emitting component 10, which in contrast to the exemplary embodiment shown in FIG. 3, comprises a conversion element 2 which takes the form of a potting compound, wherein the potting compound additionally takes the form of a beam-shaping element. In particular, the potting compound 2 has the shape of a convex lens. In this way, the radiation emitted by the semiconductor chip 1 may be purposefully modified or corrected with regard to its emission pattern and directionality.

A luminescent material 2b and an additional element 2c, which increases the refractive index of the matrix material 2a, are furthermore embedded in the matrix material 2a of the conversion element 2. The components embedded in the matrix material 2a are preferably substantially uniformly distributed in the matrix material 2a.

An additional layer 3 comprising a component which exhibits radiation-absorbing properties is preferably arranged downstream in the conversion element 2. The additional layer 3 preferably takes the form of a potting compound, wherein the potting compound, like the conversion element 2, additionally takes the form of a beam-shaping element.

The exemplary embodiment of FIG. 4 otherwise substantially corresponds to the exemplary embodiment of FIG. 3.

In the exemplary embodiment of FIG. 5, in contrast to the exemplary embodiment shown in FIG. 3, a beam-shaping element 4 is arranged on the conversion element 2. In the present case, the conversion element 2 accordingly does not itself take the form of a beam-shaping element, but instead an additional beam-shaping element 4 is used. In particular, the beam-shaping element 4 is arranged on the side of the conversion element 2 remote from the semiconductor chip 1. The beam-shaping element 4 is thus arranged on the radiation exit face 11 of the semiconductor chip 1. The beam-shaping element 4 is preferably an optical system, a lens and/or a cover.

The beam-shaping element 4 may be adhesively bonded to the semiconductor chip 1 for example by means of the conversion element 2. In this case, the conversion element 2 preferably comprises a low-melting glass, such that, when the matrix material 2a is heated, the beam-shaping element 4 may be mechanically and form-fittingly joined to the conversion element 2.

In this way, the semiconductor chip 1 may be joined form-fittingly to the matrix material 2 and to the beam-shaping element 4. In the present case, the conversion element 2a is thus used as an adhesion layer, such that an additional adhesion layer is advantageously not required.

The beam-shaping element 4 may moreover be a further conversion element which for example comprises a matrix material made from glass, a vitreous ceramic or a ceramic. The further conversion element may here comprise a luminescent material which is suitable for converting the radiation of one wavelength emitted by the semiconductor chip into radiation of another wavelength. In this way, a component may preferably be obtained which emits mixed radiation, wherein the mixed radiation is composed of at least three different wavelength ranges, namely the wavelength range of the radiation emitted by the semiconductor chip 1, the wavelength range of the radiation converted by the conversion element 2 and the wavelength range of the radiation converted by the further conversion element.

The exemplary embodiment of FIG. 5 otherwise substantially corresponds to the exemplary embodiment of FIG. 3.

Figure 6:
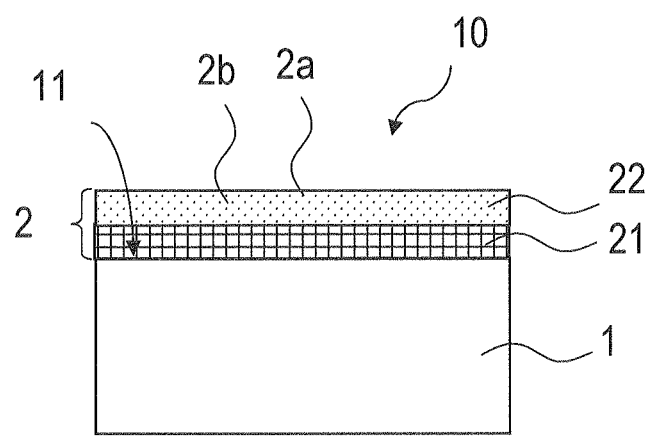

In the exemplary embodiment of FIG. 6, in contrast to the exemplary embodiment shown in FIG. 1, the conversion element 2 takes the form of a multilayer element. The conversion element 2 preferably comprises a first layer 21 and a second layer 22. The first layer 21 preferably takes the form of an adhesion layer. For example, the first layer 21 comprises the matrix material without luminescent material embedded therein. The second layer 22 preferably comprises the matrix material 2a and the luminescent material 2b embedded therein. Alternatively, the second layer 22 may also be an external conversion element, such as for example a vitreous ceramic with luminescent material.

The second layer 22 may here be adhesively bonded to the semiconductor chip 1 by means of the first layer 21. In this case, the second layer 22 preferably comprises a low-melting glass, such that, when the second layer 22 is heated, the first layer 21 may be mechanically and form-fittingly joined to the semiconductor chip 1.

The exemplary embodiment of FIG. 6 otherwise substantially corresponds to the exemplary embodiment of FIG. 1.

Figure 7:
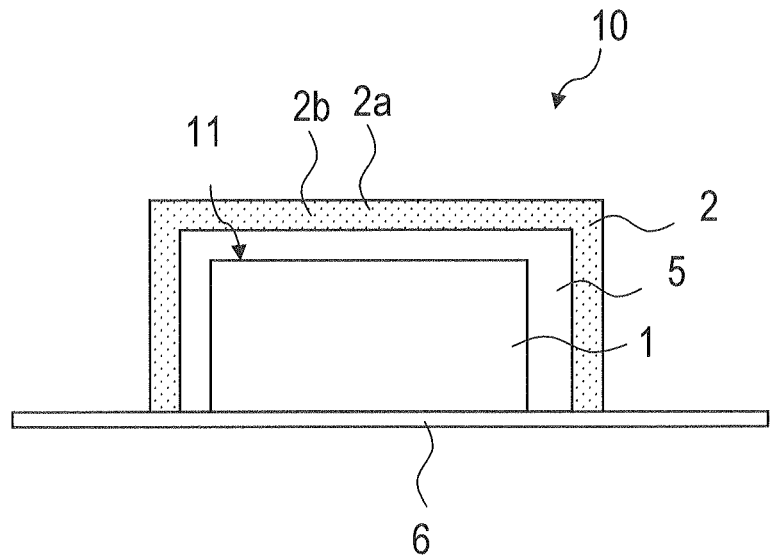

In the exemplary embodiment of FIG. 7, in contrast to the exemplary embodiment shown in FIG. 1, spacing is arranged between the conversion element 2 and the semiconductor chip 1, such that an interspace 5 is formed between conversion element 2 and semiconductor chip 1. A gas, for example air, is preferably arranged in the interspace 5.

The semiconductor chip 1 and the conversion element 2 are arranged for example on a carrier 6. The conversion element 2 may here surround the semiconductor chip 1 in spaced manner. Alternatively, the semiconductor chip 1 may be arranged in a housing (not shown), wherein for example areas of the housing serve as a bearing surface for the conversion element 2, such that spacing may be achieved in this manner between conversion element 2 and semiconductor chip 1.

The exemplary embodiment of FIG. 7 otherwise substantially corresponds to the exemplary embodiment of FIG. 1.

The description made with reference to exemplary embodiments does not restrict the invention to these embodiments, rather the invention encompasses any novel feature and any combination of features, including in particular any combination of features in the claims, even if this feature or this combination is not itself explicitly indicated in the claims or exemplary embodiments.

The invention claimed is:

1. A radiation-emitting component comprising:
   a semiconductor chip comprising an active layer suitable for generating electromagnetic radiation and a radiation exit face; and
   a conversion element comprising a matrix material and a luminescent material, wherein the matrix material comprises silver phospho-tellurite with at least 40 wt. % tellurium oxide and is free of lead, boron trioxide and germanium oxide, wherein the conversion element is arranged downstream of the radiation exit face of the semiconductor chip.

2. The component according to claim 1, wherein the matrix material is free of boron trioxide.

3. The component according to claim 1, wherein the matrix material is free of germanium oxide.

4. The component according to claim 1, wherein the conversion element is arranged directly on the radiation exit face of the semiconductor chip.

5. The component according to claim 1, wherein spacing is arranged between the conversion element and the radiation exit face of the semiconductor chip so that an interspace filled with air is formed between the conversion element and the semiconductor chip.

6. The component according to claim 1, wherein the matrix material comprises at least 75 wt. % tellurium oxide.

7. The component according to claim 1, wherein the matrix material comprises at least one additional element that increases the refractive index of the matrix material.

8. The component according to claim 1, wherein the matrix material exhibits a refractive index of greater than 2.

9. The component according to claim 1, further comprising an additional layer exhibiting radiation-absorbing properties, the additional layer arranged downstream of the conversion element.

10. The component according to claim 1, wherein a softening temperature of the matrix material is less than or equal to 350° C.

11. The component according to claim 1, wherein the conversion element or the matrix material takes the form of an adhesion layer.

12. The component according to claim 1, wherein the conversion element assumes wafer form.

13. The component according to claim 1, wherein the conversion element is formed by a potting compound in which the semiconductor chip is embedded.

14. The component according to claim 1, wherein the conversion element takes the form of a beam-shaping element.

15. The component according to claim 1, wherein an interlayer is arranged between the radiation exit face and the matrix material, the interlayer is between 1 nm and 100 nm thick, a refractive index of the interlayer is between that of the semiconductor chip and that of the matrix material.

16. A method for producing a radiation-emitting component, the method comprising:
   providing a semiconductor chip that comprises an active layer suitable for generating electromagnetic radiation and a radiation exit face; and
   applying a conversion element onto the radiation exit face of the semiconductor chip, wherein the conversion element comprises a matrix material and a luminescent material, wherein the matrix material comprises silver phospho-tellurite with at least 40 wt. % tellurium oxide and is free of lead, boron trioxide and germanium oxide,
   wherein application of the conversion element involves applying the matrix material onto the radiation exit face of the semiconductor chip and then coating it with the luminescent material, and the luminescent material sinking into the matrix material, and
   wherein a sinking temperature during said sinking is between a softening temperature of the matrix material and a hemisphere temperature of the matrix material so that the matrix material has a viscosity $\eta$ of $10^2$ dPas*s$\geq\eta\geq10^{-2}$ dPas*s.

17. A method according to claim 16, wherein the application of the conversion element further involves applying the matrix material directly onto the radiation exit face of the semiconductor chip.

18. A method according to claim 17, wherein the matrix material is deliberately coated non-uniformly with the luminescent material, such that a uniform emission pattern may be obtained.

19. A method for producing a radiation-emitting component, the method comprising:
   providing a semiconductor chip that comprises an active layer suitable for generating electromagnetic radiation and a radiation exit face; and
   applying a conversion element onto the radiation exit face of the semiconductor chip, wherein the conversion element comprises a matrix material and a luminescent material, wherein the matrix material comprises silver phospho-tellurite with at least 40 wt. % tellurium oxide and is free of lead, boron trioxide and germanium oxide.

20. The method of claim 19, wherein the application of the conversion element involves applying the matrix material onto the radiation exit face of the semiconductor chip and then coating the matrix material with the luminescent material.

* * * * *

UNITED STATES PATENT AND TRADEMARK OFFICE
CERTIFICATE OF CORRECTION

PATENT NO.        : 8,890,140 B2
APPLICATION NO.   : 13/580858
DATED             : November 18, 2014
INVENTOR(S)       : Angela Eberhardt It is certified that error appears in the above-identified patent and that said Letters Patent is hereby corrected as shown below:

On the Title Page, item (73) Assignees, lines 1-2, delete "OSRAM OPTO Semiconductor GmbH," and insert --OSRAM OPTO Semiconductors GmbH,--.

Signed and Sealed this
Twenty-sixth Day of January, 2016

Michelle K. Lee
*Director of the United States Patent and Trademark Office*